United States Patent
Huynh et al.

(10) Patent No.: US 6,863,787 B2
(45) Date of Patent: Mar. 8, 2005

(54) DUMMY COPPER DEPROCESSING

(75) Inventors: Chuong T. Huynh, Quincy, MA (US); Neil J. Bassom, Hamilton, MA (US)

(73) Assignee: FEI Company, Hillsboro, OR (US)

(*) Notice: Subject to any disclaimer, the term of this patent is extended or adjusted under 35 U.S.C. 154(b) by 147 days.

(21) Appl. No.: 10/405,898

(22) Filed: Apr. 2, 2003

(65) Prior Publication Data

US 2004/0203249 A1 Oct. 14, 2004

(51) Int. Cl.[7] .............................. C23C 14/34; C23F 1/00
(52) U.S. Cl. ............................ 204/192.34; 204/192.35; 216/66
(58) Field of Search ......................... 204/192.34, 192.35, 204/298.33, 298.36; 216/66; 156/345.4

(56) References Cited

U.S. PATENT DOCUMENTS

| | | | |
|---|---|---|---|
| 5,188,705 A | 2/1993 | Swanson et al. ............ | 156/643 |
| 5,435,850 A | 7/1995 | Rasmussen ................. | 118/726 |
| 5,851,413 A | 12/1998 | Casella et al. ............... | 216/92 |
| 5,958,799 A | 9/1999 | Russell et al. .............. | 438/712 |
| 6,322,672 B1 | 11/2001 | Shuman et al. ......... | 204/192.34 |
| 6,641,705 B2 | 11/2003 | Phaneuf et al. ......... | 204/192.34 |

Primary Examiner—Steven Versteeg
(74) Attorney, Agent, or Firm—Michael O. Scheinberg

(57) ABSTRACT

A method of improving focused ion beam milling particularly suitable for uniformly removing multiple layers of conductor and dielectric, such as the removal of multiple layers consisting of dummy copper pads and $SiO_2$ on a semiconductor device. Variable Pixel Milling is first used to more uniformly remove most of a layer of conductor and dielectric. The use of Variable Pixel Milling may also be used in conjunction with a technique whereby incoming ions pass through a sacrificial layer formed on the surface of the layer being removed in order to further increase uniformity of material removal. Focused ion beam sputtering in conjunction with an oxygen containing gas, such as $H_2O$ vapor or oxygen, is then used to smooth out the trench floor before the next layer is removed.

27 Claims, 6 Drawing Sheets

DUMMY COPPER DEPROCESSING

TECHNICAL FIELD OF THE INVENTION

The present invention relates to the field of charged particle beam processing and, in particular, to a method for uniformly removing multiple layers of conductor and dielectric from semiconductor circuits using a focused ion beam.

BACKGROUND AND SUMMARY OF THE INVENTION

Semiconductor devices such as microprocessors can be made up of millions of transistors, each interconnected by thin metallic lines branching over several levels and isolated electrically from each other by layers of dielectric materials. When a new semiconductor design is first produced in a semiconductor fabrication facility, it is typical to find that the design does not operate exactly as expected. It is then necessary for the engineers who designed the device to test their design and "rewire" it to achieve the desired functionality. Due to the complexity of building a semiconductor device in the semiconductor fabrication facility, it typically takes weeks or months to have the re-designed device produced. Further, the changes implemented frequently do not solve the problem or expose a yet further difficulty in the design. The process of testing, re-designing and re-fabrication can significantly lengthen the time to market new semiconductor devices.

Circuit editing—the process of modifying a circuit during its development without having to remanufacture the whole circuit—provides tremendous economic benefits by reducing both processing costs and development cycle times. In most cases, the feature to be modified is buried under other material, such as insulating layers, and, in the case of "flip chips," semiconductor layers. Therefore it is typically necessary to mill down through these layers of materials to reach the metal feature of interest without damaging adjacent circuit features. Once the feature is exposed, circuit editing normally requires that the feature of interest either be cut to break an electrical connection or electrically connected to other features by ion beam assisted deposition of conducting "straps."

Over the past decade, techniques have been developed to allow Focused Ion Beam (FIB) systems to reduce the time required for this procedure of perfecting a design. FIB systems produce a narrow, focused beam of charged particles (hereinafter referred to as ions) which is typically scanned across a specimen in a raster fashion, similar to a cathode ray tube. In most commercial FIB systems, the ions used are positively charged gallium ions ($Ga^+$) from liquid metal ion sources. Modern FIB systems can be used to form an image of a sample surface much like an electron microscope. The intensity at each point of the image is determined by the current of secondary electrons or other particles ejected by the ion beam at the corresponding point on the substrate. The ion beam can also be used to remove material from the sample surface or to deposit material (typically by using a gas that decomposes in the presence of the ion beam and deposits material onto the surface.). When used to remove material, the heavy gallium ions in the focused ion beam physically eject atoms or molecules from the surface by sputtering, that is, by a transfer of momentum from the incoming ions to the atoms at the surface.

FIB instruments were first used to "cut" metal lines, typically comprised of alloys of aluminum and/or tungsten, on prototype devices, thus allowing for design verification in simple cases. Both aluminum and tungsten can be milled by rastering a beam of gallium ions across the area of interest. The beam is typically scanned across the area to be milled using digital electronics that step the beam from point to point. The distance between points is referred to as the pixel spacing. Pixel spacing is typically less than the beam spot size, that is, each subsequent beam position overlaps the previous position to ensure a uniform cut and a smooth finish. This method is referred to as 'Default Milling'. Milling methods have been well documented, for example, in U.S. Pat. No. 5,188,705 to Swanson, et. al. for "Method of Semiconductor Device Manufacture".

Chemistries have also been developed that selectively attack aluminum, causing it to sputter much more quickly in the presence of certain gases than with just the ion beam alone. This process is well-known within the art and is commonly referred to as Gas Assisted Etching (GAE). Because it speeds up the removal process, GAE can be used, for example, to mill relatively large areas of a surface layer or layers to expose underlying layers for observation and testing. Further, techniques have been developed using special gas chemistries in the FIB system to permit selective deposition of thin metallic lines to connect two or more conductors, selective removal of dielectric insulators but not metallic interconnects, and selective removal of metal interconnects without removing the dielectric insulators. Essentially, these capabilities now permit prototyping and design verification in a matter of days or hours rather than weeks or months as re-fabrication would require.

Until recently, the typical metals used for metallic interconnects were primarily alloys of aluminum and/or tungsten. Traditionally, the circuit pattern was formed on a semiconductor chip by a photolithographic process which includes depositing one or more metallization layers (such as an aluminum alloy film) and etching the desired pattern into each metallization layer. The above described advances in FIB system techniques for cutting and depositing metal interconnects were specifically designed for these metal alloys and their particular physical characteristics.

In recent years, semiconductor manufacturers have begun a migration toward the use of copper as a replacement for aluminum interconnects. As manufacturers strive to increase the speed at which chips work, the use of copper interconnects provides several advantages over aluminum. For example, copper has lower sheet resistance and exhibits both improved metal line and line/via/line electromigration reliability.

Although the advantages of copper over aluminum have been known for some time, copper is very difficult to etch. As a result, it is impractical to manufacture copper interconnects using the typical process of depositing a metallization layer and then etching the desired pattern. Instead, copper wiring is typically patterned using a single or dual damascene process that reverses conventional metallization. Rather than depositing dielectric into spaces etched in metal, a damascene process cuts lines into the dielectric, fills them with metal, then polishes the excess metal away using a process known as chemical mechanical polishing (CMP).

CMP typically makes use of an abrasive slurry and one or more polishing pads to remove excess material and achieve global planarization of a wafer surface. However, determining the exact end point for the CMP process can be difficult. A main reason for this is that different materials polish at different rates. Copper is much softer than typical dielectric materials such as $SiO_2$, and as a result it polishes away more quickly. Copper lines and pads tend to "dish" or be overpolished in the center. Further, thin or isolated features tend to polish more rapidly than dense features since the entire force of the polishing pad is directed at a smaller area. Erosion occurs when narrow arrays of copper and dielectric polish more quickly than non-patterned areas.

Both dishing and erosion can thin the metal wiring and thus increase the sheet resistance of the metal wiring. Further, the increase in sheet resistance is not constant. The sheet resistance may increase by tens of percentage points depending on the circumstances and the layout of the metal wiring. Erosion can result in a sub-planar dip on the wafer surface. When the subsequent layer of interconnect is completed, a shallow "pool" of copper can fill this dip, causing short-circuits between adjacent wires.

One way to reduce dishing and erosion is the use of dummy features to create a uniform pattern density across the entire wafer surface. For example, wherever the distance between any active features in a wiring layer is greater than a certain minimum width, dummy copper pads can be formed in the dielectric so that the entire wafer surface will polish at a uniform rate. The placement of this type of dummy feature is referred to as "tiling" because the dummy features look like tiles when viewed from above. Ideally, the use of dummy copper pads or tiles keeps the relative percentage of copper to dielectric constant over the entire wafer surface.

A problem arises, however, when one or more layers containing dummy copper pads and dielectric must be removed to allow circuit editing of active features on a lower layer. The same types of difficulties that make it difficult to etch copper to form circuit wires also make it difficult to remove relatively large areas of dummy copper and dielectric. FIB sputtering of copper is much more difficult than sputtering aluminum alloys. Aluminum atoms have a lower atomic mass and less "stopping power" than copper atoms. As a result, simple ion beam milling of the copper atoms is less effective than the equivalent milling of aluminum. Further, a gas chemistry that permits GAE of copper has not yet been successfully developed. The halogens that are used to enhance focused ion beam etching of other metal interconnect materials do not significantly enhance the etching of copper, and no other chemical suitable for routine FIB milling of copper has been found. The etch byproducts formed during the use of halogen compounds on copper at room temperature have low volatility and tend to leave detrimental deposits on the sample surface and via side walls.

Moreover, the milling of copper without chemicals has been found to produce non-uniform material removal, even when the ion beam is applied uniformly. This non-uniform milling is thought to be attributable to a number of factors, including the formation of etch-resistant copper regions and differences in the crystallographic orientation within the copper layer being milled. The non-uniform copper removal causes the floor of the etched area to become non-planar, which in-turn can cause unacceptable milling of the material under the copper conductor; i.e., as milling continues to remove the remaining copper from one region under the ion beam, significant damage is incurred by milling the exposed underlayer in areas where the copper has already been removed.

These problems are exacerbated when layers comprising both copper and dielectric need to be removed. For example, during circuit editing it is common to have to clear a relatively large area of multiple layers, each layer having copper and dielectric materials embedded in the same layer. When these types of mixed layers are sputtered by a FIB, the difference in sputtering rate between copper and the dielectric material also tends to result in a non-uniform milling floor.

All of these problems tend to worsen as multiple layers are removed. As many as eight such layers are common for modern semiconductor design. Usually, after only two or three layers, copper from different levels is being exposed and milled simultaneously. This makes FIB circuit edits of circuitry buried underneath a large number of mixed copper and dielectric layers very challenging.

Although several techniques to improve the uniformity of copper milling are known, as discussed in greater detail below, none of these techniques adequately solve the problems of milling through mixed copper and dielectric layers. Hence, there is a need for an improved technique to allow more uniform milling through multiple layers of mixed copper and dielectric.

SUMMARY OF THE INVENTION

An object of the invention, therefore, is to provide a method for more uniformly removing multiple layers of conductor and dielectric—such as the removal of multiple layers consisting of dummy copper pads and $SiO_2$—in a manner allowing circuit edits of active features buried underneath these layers. A preferred embodiment of the invention described and claimed herein comprises the use of a combination of charged particle beam milling techniques to accomplish this goal.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

A preferred embodiment of this invention provides a method for uniformly removing multiple layers of mixed conductor and dielectric—such as the removal of multiple layers consisting of dummy copper pads surrounded by SiO$_2$—in a manner allowing circuit edits of active features buried underneath these layers. The present invention comprises a novel combination of the techniques and processes discussed below to accomplish this goal.

Preferred embodiments of the present invention are directed to a method used for milling of materials, particularly crystalline materials such as copper-based dummy features within semiconductor devices. Although much of the following description is directed toward copper milling and specifically copper milling within semiconductor devices, the apparatus and methods of the present invention could equally be utilized in the milling of other materials. The techniques described herein can be used by themselves or in combination with other techniques. Hence, the scope of the present invention should not be limited to simply the milling of copper-based crystalline structures.

Figure 1A:
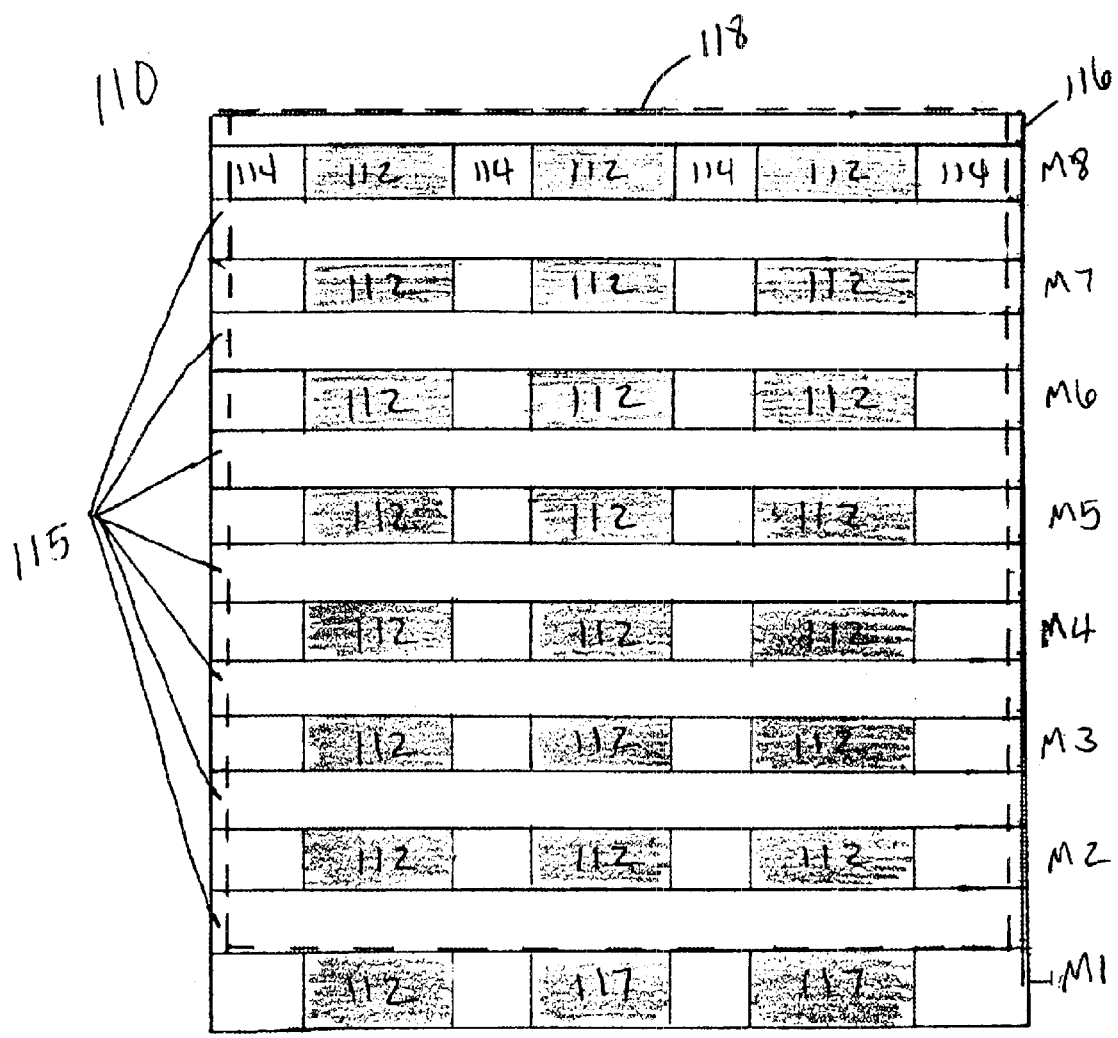
FIG. 1A is a cross sectional view of a typical prior integrated circuit

FIG. 1A is a cross sectional view showing schematically a portion of a typical integrated circuit 110. As shown in FIG. 1A, integrated circuit 110 includes multiple metallization layers M1–M8. Each metallization layer M1–M8 includes dummy copper pads 112 and dielectric material 114. Metallization layers M1–M8 are each separated by dielectric layers 115. The surface of integrated circuit 110 is covered by passivation layer 116. The bottom metallization layer includes copper interconnects 117. Target box 118 shows two dimensions of an area of mixed metal and dielectric to be removed (for example, width and depth). The third dimension of target box 118 (in this case, length) extends into the page and is not shown in FIG. 1A.

Figure 1B:
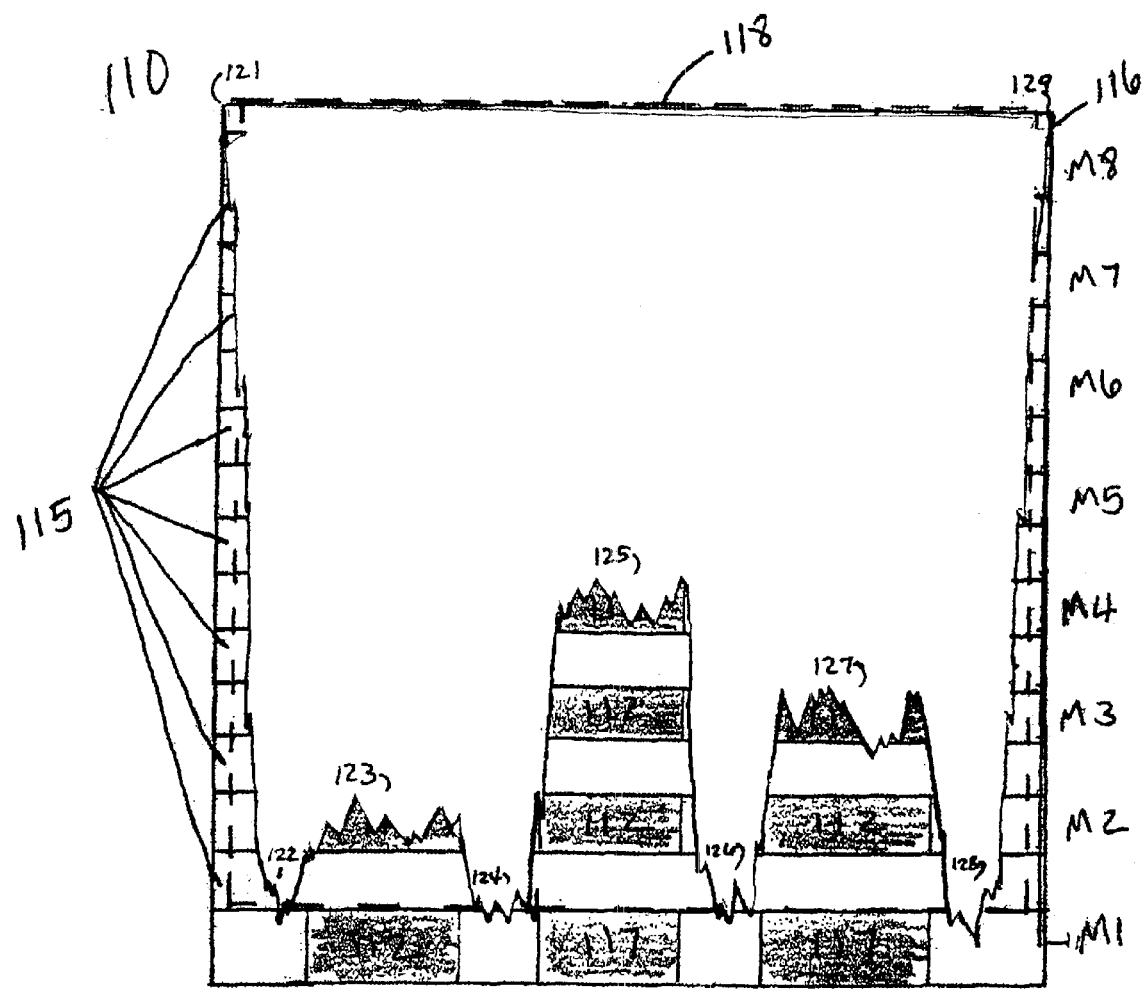
FIG. 1B is a cross sectional view of the typical prior integrated circuit in FIG. 1A after milling with a prior art FIB system.

FIG. 1B is a cross sectional view showing schematically a portion of the typical integrated circuit in FIG. 1A if target box 118 were to be etched using only Default Milling with a typical FIB. As shown in FIG. 1B, the uneven milling of copper and dielectric has resulted in a very non-planar floor. In regions 122, 124, 126, and 128, metallization layers M2–M8, along with the top passivation layer 116 and dielectric layers 115, have been removed. Some overmilling in regions 122, 124, 126, and 128 has resulted in damage to layer M1. In region 123, layers M3–M8 have been removed, along with the top passivation layer 116 and six dielectric layers 115, but a portion of layer M2 and all underlying layers remains. In region 125, layers M5–M8, along with the top passivation layer 116 and four dielectric layers 115, have been removed, but a portion of layer M4 and all underlying layers remains. In region 127, layers M4–M8, along with the top passivation layer 116 and five dielectric layers 115, have been removed, but a portion of layer M4 and all underlying layers remains. In regions 121 and 129, a small portion of the top passivation layer and all underlying layers remains.

The tendency of mixed copper and dielectric layers to mill unevenly and inefficiently, as illustrated by FIG. 1B, can be caused by a number of different factors. Non-uniform milling of copper is thought to be partially attributable to the formation of a resistant copper region that forms during milling and propagates across the area exposed to the ion beam. This resistant copper region appears to channel incoming ions into the crystal, thereby reducing the sputtering rate of copper by the incoming ions. The region appears black when imaged using the ion beam in secondary electron mode, apparently because the increased channeling of the incoming ions also reduces the ejection of secondary electrons near the surface.

The region is thought to be composed of a Cu—Ga alloy. Once formed, this area inhibits the surface-sputtering rate by a factor of between about 2 to about 4. Because this area forms over time during the milling procedure and because of channeling variations, the area exposed to the focused ion beam will etch non-uniformly.

One method of improving the uniformity of copper milling is known as Variable Pixel Milling (VPM). This process is described in greater detail in U.S. Pat. No. 6,322,672 to Shuman et al. for "Method And Apparatus For Milling Copper Interconnects In A Charged Particle Beam System," which is assigned to FEI Company, Hillsboro, Oreg., the assignee of the present invention, and which is also hereby incorporated by reference. VPM can be used to etch copper more uniformly by initially moving the ion beam, not in the typical raster pattern of overlapping pixels, but in a pattern of non-contiguous points. As the milling continues, the milling points move progressively closer together until, to complete the milling, a more typical raster pattern of overlapping points can be applied. VPM appears to inhibit the formation of etch-resistant areas within the copper, perhaps by reducing localized heating of the copper conductor. Milling non-contiguous locations may allow energy imparted by the impact of the ion beam at one location to dissipate before the beam returns to that area, thereby preventing the accumulation of energy necessary to cause formation of the etch resistant region.

VPM makes use of a series of milling steps. For each step, a milling box can be defined as a group of milling locations or pixels spaced apart by specified amounts in the x and y directions. An average ion dose, expressed as charge per unit area, is specified for each milling box. The ion beam moves between pixels in the box until each pixel has received approximately the designated average ion dosage specified for the box. At each pixel, a hole having a diameter roughly equivalent to the beam spot size is milled. In applying the dose, the ion beam typically visits each pixel multiple times, rather than delivering the entire dose for each pixel during a single dwell period. After the first milling step is completed, the sample surface will have multiple holes separated by unmilled material. The result is a series of segregated copper islands that suppress the formation of the highly channeling black region.

Multiple milling steps can be applied, each having successively closer pixels. Some of the holes milled in subsequent boxes will typically overlap previously milled holes. Upon finishing the complete set of milling steps, however, the amount of material removed from each point in the sample is approximately equal to produce a uniform, planar floor over the entire area milled. The last milling step typically uses conventional pixel spacing, that is, the pixel spacing is smaller than the beam spot size. When applied to a copper layer, VPM milling produces a smoother, more uniformly milled area than is produced by milling solely using a typical raster pattern.

In addition to the formation of resistant copper regions, uneven copper milling can also be caused by differences in crystal orientation within a given copper layer. Copper interconnect lines and dummy features are composed of small, contiguous grains of copper. Within each grain, the atoms share a regular array-like order, but the relative position of the arrays of atoms can vary from grain to grain. This alignment of the arrays of atoms is known as the "crystallographic orientation" of a given grain. Differences in crystallographic orientation can cause grains sputtered or milled with an ion beam to be removed at different rates, depending, on the given orientation. For copper, the relative sputter rate between grains of different crystallographic orientations of copper can differ by a large factor, as much as 360% in some experimental tests.

Uniformity of copper removal can be improved by passing incoming ions from the FIB through a sacrificial layer formed on the surface of the copper. This process is described in greater detail in U.S. Pat. No. 6,641,705, issued Nov. 4, 2003 for an "Apparatus And Method For Reducing Differential Sputter Rates," which is hereby incorporated by reference. The sacrificial layer is thought to reduce or eliminate the effect of the crystal structure on FIB milling of the substrate by deflecting the incoming ions so as to change the angle of incidence between the ions and the substrate atoms and by disrupting the crystal structure of the substrate as the ion beam drives atoms of the sacrificial layer into the substrate structure. Which of these mechanisms predominates will vary with the particular application.

The sacrificial layer is preferably sufficiently thin to allow a large number of ions in the primary beam to pass through the layer and sputter away the substrate material. The sacrificial layer is also sufficiently thin to allow the sputtered substrate material to leave the surface without immediately destroying the sacrificial layer. As the ion beam dwells at a particular pixel, the sacrificial layer is eventually removed, being gradually eroded by sputtering and by being mixed into the substrate material, which is then sputtered. The sacrificial layer is then reapplied before or during the next dwell period.

In one preferred embodiment, a tungsten hexacarbonyl gas delivery system is used to deliver a precursor gas that decomposes to form the sacrificial layer. To generate this sacrificial layer, the parameters of gas pressure, ion beam dwell time, ion beam refresh time (that is, the time between successive dwells at the same pixel), ion beam current, pixel size and pixel spacing are selected so that, rather than building up a layer of deposited tungsten hexacarbonyl as conventionally occurs, just a thin layer of precursor gas is allowed to be adsorbed at the surface of the copper layer before the ion beam converts the gas into a tungsten based sacrificial layer by driving off some of the carbonyl compounds. This conversion leaves FIB deposited tungsten that is a fine grained, possibly with some gallium and carbon incorporated. After the conversion, the ion beam further sputters away the thin tungsten layer, along with the underlying copper or other material.

Because the use of this type of sacrificial layer helps to mill copper more uniformly, it allows relatively large areas of copper to be removed at a constant rate. This helps produce a uniform, planar floor in the entire area of the copper being milled.

Uneven milling of copper can also lead to uneven milling of the surrounding dielectric, especially when multiple layers of copper and dielectric are being removed. Non-uniform removal of dummy copper layers can result in a copper layer being completely removed in some areas but small amounts of copper remaining in other areas. This, in turn, can result in overmilling the dielectric under the areas where the copper has been completely removed. In some cases, before all the copper in one area has been removed, the dielectric under the areas where copper has been removed can be completely milled away, exposing and milling the copper layer underneath.

Depending upon the material beings milled and the material located below the material being milled, it is sometimes possible to introduce a gas, typically near the end of the milling process, that selectively inhibits the etching of the material below the material being milled. For example, when milling a copper material positioned on a dielectric material such as a silicon oxide, an oxygen containing gas, such as water vapor or oxygen, can be introduced to selectively inhibit the etching of the oxide layer over the copper material, thereby promoting a smooth floor to the milled area. The use of water vapor in focused ion beam etching is described in U.S. Pat. No. 5,958,799 to Russell, et al. for "Method for Water Vapor Enhanced Charged-Particle-Beam Machining."

Figure 2:
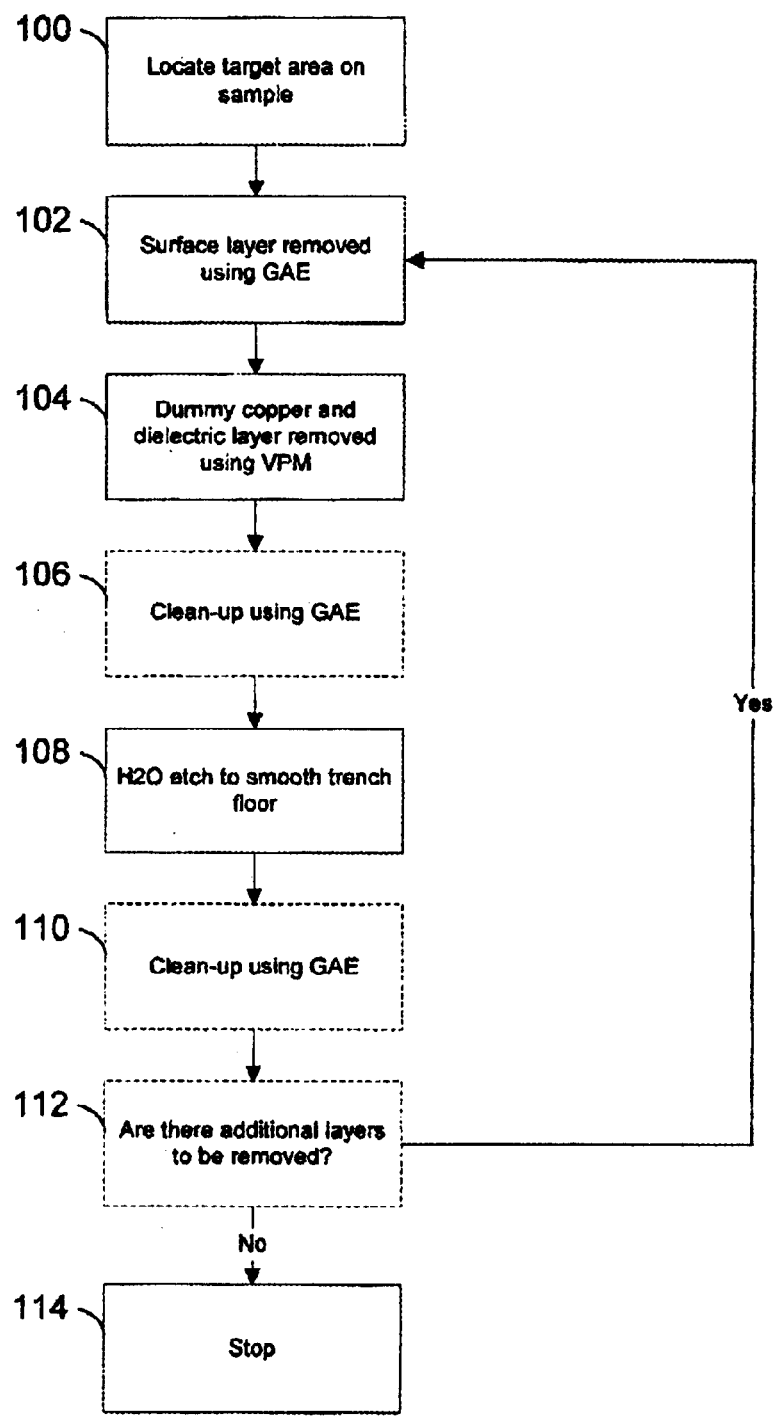
FIG. 2 is a flowchart showing the steps of a preferred embodiment of the present invention.

FIG. 2 is a flowchart showing the steps involved in a preferred embodiment of the present invention which could be used to mill away multiple layers of mixed dummy copper and dielectric. In step 100, a target area to be milled is located on the sample. Typically, where one or more layers of copper and dielectric must be removed from a semiconductor device to allow circuit editing, the target area will comprise a repair box sufficiently large to expose the appropriate buried active feature for editing. Further, where more than two layers of copper and dielectric must be removed, the initial target area would preferably be defined as a repair box larger than the final desired repair box. If, for example, a 20 $\mu$m×20 $\mu$m repair box is required for the final layer, the initial target area would preferably be defined as a repair box larger than 20 $\mu$m×20 $\mu$m. In order to compensate for undesirable over-etching that occurs at the edges of a repair box, for every two layers to be removed, the repair box can be reduced by 2–3 $\mu$m to eliminate edge enhancement for the final 20 $\mu$m×20 $\mu$m repair box. To illustrate, if eight dummy copper layers are to be removed, the initial repair box could be 30 $\mu$m×30 $\mu$m. For every two layers removed, the repair box could be reduced by 2–3 $\mu$m so that the final repair box (used when removing the eighth dummy copper layer) could be 20 $\mu$m×20 $\mu$m.

In step 102 any surface passivation layer or dielectric is removed using focused ion beam sputtering in conjunction with an etch-enhancing gas such as $XeF_2$. This step serves to expose the top dummy copper layer. Method of removing layers of typical passivation and dielectric materials are well known in the art. Ion dose should be sufficient to expose the dummy copper layer and to mill away some of the dielectric surrounding the dummy copper pads. The appropriate ion dose will vary depending on the composition and thickness of the materials to be milled and can be determined experimentally using the examples and information provided above and below as a guide.

In step 104, the dummy copper pads are removed using multiple steps of Variable Pixel Milling (VPM) as discussed above. VPM can be used to etch copper more uniformly by initially moving the ion beam in a pattern of non-contiguous pixels with the distance between pixels greater than the beam diameter. This first milling step results in a sample surface with multiple milled holes separated by unmilled material. Such a series of segregated copper islands suppresses the formation of resistant copper regions.

Multiple VPM milling steps can be applied, with each having successively closer pixels. Although preferably only two such VPM steps are used, in some circumstances it may be beneficial to use more than two VPM steps. In either case, the last milling step will typically use conventional pixel spacing, that is, pixel spacing that is smaller than the beam spot size, to produce a smooth, uniformly milled area. Upon completion of all VPM milling steps, the amount of material removed from each point in the sample should be approximately equal over the entire area milled. The number of VPM milling steps and the appropriate ion dose will vary depending on the thickness of the copper pads and can be determined experimentally using the examples and information provided above and below as a guide.

During VPM, deposition of metal such as tungsten or platinum can also be employed to further improve milling uniformity. During this procedure, the tungsten hexacarbonyl gas, for example, is continuously flowing onto the exposed copper surface. For each pixel within the repair box, during the first fraction of this dwell time, the ion beam converts the adsorbed tungsten hexacarbonyl gas to a tungsten based crystalline structure at a dwell point or pixel. As the tungsten layer is being deposited and after the precursor gas is exhausted, individual ions are interacting with the tungsten layer to enhance etching of the underlying copper layer. Eventually, the tungsten layer is sputtered away along with copper material that the deflected ions collide with.

In optional step 106, any residual particles resulting from redeposition or other processes are removed using focused ion beam sputtering in conjunction with an etch-enhancing gas such as $XeF_2$. This step may become more desirable as more layers are removed. The use of GAE as a clean-up step is well known in the art.

In step 108, focused ion beam sputtering in conjunction with an oxygen containing gas, such as $H_2O$ vapor or oxygen is used to smooth out the trench floor. The introduction of the oxygen containing gas will selectively inhibit the etching of the dielectric, such as $SiO_2$, allowing the copper to be completely removed in resistant areas without over-milling the dielectric layer beneath. The appropriate endpoint can be determined, for example, by real-time imaging of the repair box during milling, which typically will clearly show when the copper has been milled away. When the focused ion beam is operated in secondary electron mode, the copper typically shows up much brighter than the dielectric.

In optional step 110, a clean-up step comprising focused ion beam sputtering in conjunction with an etch-enhancing gas such as $XeF_2$ can be repeated if necessary to remove any remaining residual particles.

Step 112 asks whether any additional layers are to be removed. At this point, the target copper and dielectric layer has been removed resulting in a flat-bottomed crater. If additional layers are to be removed, steps 102 through 112 are repeated for each layer to be removed. The complete removal of the each target copper and dielectric layer and the $H_2O$ etch to smooth out the trench floor before any additional milling allows multiple copper and dielectric layers to be removed with improved floor uniformity over the prior art. If no more layers are to be removed, in step 114 the process stops.

Figure 3:
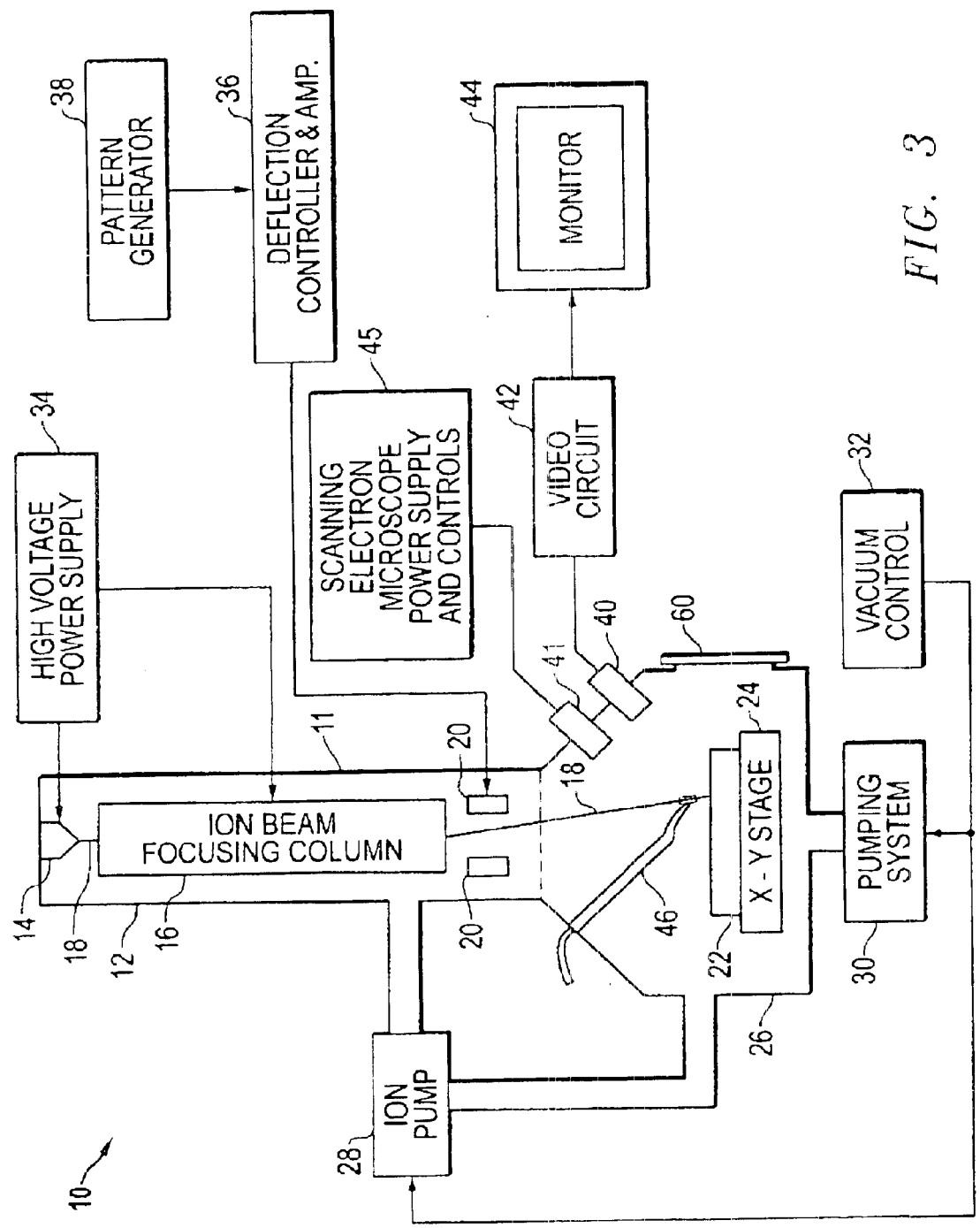
FIG. 3 shows schematically a typical focused ion beam system used in a preferred embodiment of the invention.

FIG. 3 shows a typical focused ion beam system 10 used to implement the present invention. Focused ion beam system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-4}$ Torr. If an etch assisting, an etch retarding gas, or a deposition precursor gas is used, the chamber background pressure may rise, typically to about $1\times10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of sample 22. In some systems the deflection plates are placed before the final lens, as is well known in the art.

The source 14 typically provides a metal ion beam of gallium, although other ion sources, such as a multicusp or other plasma ion source, can be used. The source typically is capable of being focused into a sub one-tenth micron wide beam at sample 22 for either modifying the sample 22 by ion milling, enhanced etch, material deposition, or for the purpose of imaging the sample 22. A charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a charged particle multiplier 40 can be coaxial with the ion beam and include a hole for allowing the ion beam to pass. A scanning electron microscope 41, along with its power supply and controls 45, are optionally provided with the FIB system 10.

A gas delivery system 46 extends into lower chamber 26 for introducing and directing a gaseous vapor toward sample 22. U.S. Pat. No. 5,851,413 to Casella et al. for "Gas Delivery Systems For Particle Beam Processing," assigned to the assignee of the present invention, describes a suitable fluid delivery system 46. Another gas delivery system is described in U.S. Pat. No. 5,435,850 to Rasmussen for a "Gas Injection System," also assigned to the assignee of the present invention.

A door 60 is opened for inserting sample 22 onto stage 24, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 16 for energizing and focusing ion beam 18. When it strikes sample 22, material is sputtered, that is physically ejected, from the sample. Focused ion beam systems are commercially available, for example, from FEI Company, Hillsboro, Oreg., the assignee of the present application.

One particular example of a set of procedures according to the present invention and predetermined parameters that can be used to successfully sputter copper with relative uniformity are now described. Initially for this procedure, a semiconductor component with multiple layers containing dummy copper pads surrounded by $SiO_2$ dielectric material is placed in a FIB system, and a 30 $\mu$m×30 $\mu$m repair box is defined. The base pressure in the FIB chamber starts in the order of $1\times10^{-7}$ Torr. Next, a $XeF_2$ gas nozzle is inserted and, by opening the nozzle valve, the pressure in the chamber is raised to about $1\times10^{-5}$ Torr using standard procedures. Any surface passivation layer, such as SiON, and some of the $SiO_2$ is then removed by gas assisted milling with a gallium ion beam tuned to a 1.5 nA beam current and using a 200 $\mu$m aperture. Default serpentine scanning can be employed, with pixel spacing of 0.15 $\mu$m, a dwell time of 0.5 $\mu$sec, a refresh time of 5000 $\mu$sec, and a retrace time of 10 $\mu$sec.

The mill dose that should be applied will vary based upon the thickness of the material to be removed. The dose should be sufficient to expose the dummy copper pads and to remove enough of the SiO2 so that the trench floor will have a fairly good uniformity after the copper is removed as discussed below. A typical dose for the $XeF_2$ mill of a first dummy copper layer would be 0.8 nC.

After the dummy copper pads are exposed, the copper is milled using VPM as discussed above. A tungsten sacrificial layer can also be employed to reduce or eliminate the effect of the crystal structure on FIB milling of the copper, as also discussed above.

For the first VPM milling step (VPM1), a tungsten hexacarbonyl gas nozzle is inserted and, by opening the nozzle valve, the pressure in the chamber is raised to about $1 \times 10^{-5}$ Torr using standard procedures. The sample is then milled using a gallium ion beam with a 200 $\mu$m aperture and a 1.5 nA beam current. Default serpentine scanning is employed, with pixel spacing of 0.4 $\mu$m, a dwell time of 500 $\mu$sec, a refresh time of 10 $\mu$sec, and a retrace time of 10 $\mu$sec.

The dose necessary to remove the copper pads will vary depending on the thickness of the layers to be removed. In this example, for a copper layer with a thickness of 1.6 $\mu$m, the VPM1 dose would be approximately 1.2 nC; for a copper layer with a thickness of 0.9 $\mu$m, the VPM1 dose would be approximately 1.0 nC; finally, for a copper layer with a thickness of 0.3 $\mu$m, the VPM1 dose would be approximately 0.4 nC.

In this example, only one subsequent VPM milling step is performed. For VPM2, no tungsten deposition is employed. Instead the sample is milled using a default mill with a gallium ion beam with a 200 $\mu$m aperture and a 1.5 nA beam current, and with pixel spacing of 0.02 $\mu$m, a dwell time of 5 $\mu$sec, a refresh time of 10 $\mu$sec, and a retrace time of 10 $\mu$sec.

As with VPM1, the dose used for VPM2 will vary depending on the thickness of the material to be removed. In this example, where the initial copper layer had a thickness of 1.6 $\mu$m, the VPM2 dose would be approximately 1.43 nC.

A standard clean-up step can optionally be used to remove any residual particles resulting from redeposition or other processes. The use of focused ion beam sputtering in conjunction with an etch-enhancing gas such as $XeF_2$ is well known in the art.

After the dummy copper pads are removed using VPM, focused ion beam sputtering in conjunction with an oxygen containing gas, such as water vapor or oxygen is used to remove any residual copper and to smooth out the trench floor. For this $H_2O$ etch, a water vapor nozzle is inserted and, by opening the nozzle valve, the pressure in the chamber is raised to about $6.7 \times 10^{-6}$ Torr using standard procedures. The sample is then milled using a gallium ion beam with a 200 $\mu$m aperture and a 1.5 nA beam current. Default serpentine scanning is employed, with pixel spacing of 0.15 $\mu$m, a dwell time of 0.5 $\mu$sec, a refresh time of 5000 $\mu$sec, and a retrace time of 10 $\mu$sec. A dose of 1.0 nC will typically be sufficient to smooth the trench floor.

The following table summarizes effective milling doses used experimentally to remove eight dummy copper layers of varying thickness using the set of procedures above.

TABLE 1

| Dummy Cu Layer | Layer Thickness | XeF2 Mill Dose (nC) | VPM1 Dose (nC) | VPM2 Dose (nC) | 1st XeF2 Clean-up Dose (nC) | H2O Etch Dose (nC) | 2nd XeF2 Clean-up Dose (nC) |
|---|---|---|---|---|---|---|---|
| 1st layer (M1) | 1.6 $\mu$m | 0.8 | 1.2 | 1.43 | not applied | 1.0 | not applied |
| 2nd layer (M2) | 1.6 $\mu$m | 1.0 | 1.2 | 1.6 | not applied | 1.0 | not applied |
| 3rd layer (M3) | 0.9 $\mu$m | 0.7 | 1.0 | 1.0 | 0.02 | 1.0 | not applied |
| 4th layer (M4) | 0.9 $\mu$m | 0.7 | 1.0 | 1.12 | 0.01 | 1.0 | not applied |
| 5th layer (M5) | 0.3 $\mu$m | 0.3 | 0.4 | 0.62 | 0.02 | 1.0 | 0.05 |
| 6th layer (M6) | 0.3 $\mu$m | 0.3 | 0.4 | 0.89 | 0.05 | 1.0 | 0.05 |
| 7th layer (M7) | 0.3 $\mu$m | 0.3 | 0.4 | 0.52 | 0.04 | 1.0 | 0.05 |
| 8th layer (M8) | 0.3 $\mu$m | 0.3 | 0.4 | 0.92 | 0.03 | 1.0 | 0.05 |

Figure 4A:
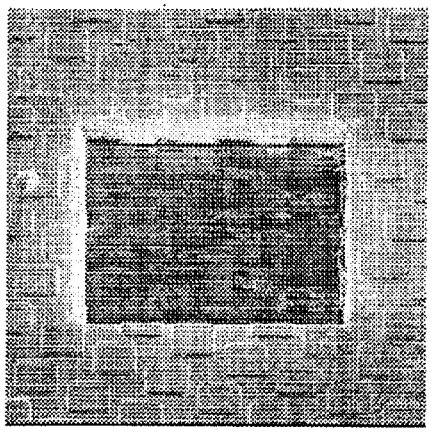
FIGS. 4A–4I are FIB micrographs illustrating the removal of eight dummy copper and dielectric layers using a preferred embodiment of the present invention.
Figure 4B:
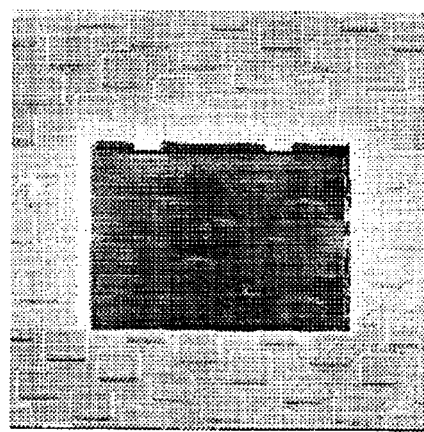

FIGS. 4A–4I are FIB micrographs taken of a sample showing the removal of a 20 $\mu$m×20 $\mu$m area of eight dummy copper and dielectric layers using the present invention and the set of procedures and parameters described above. FIG. 4A shows the sample after the first dummy copper and dielectric layer has been removed via VPM with a tungsten sacrificial layer, but before the $H_2O$ etch used to remove any residual copper and to smooth out the trench floor. FIG. 4B shows the sample after the first dummy copper and dielectric layer has been removed and after an $H_2O$ etch.

Figure 4C:
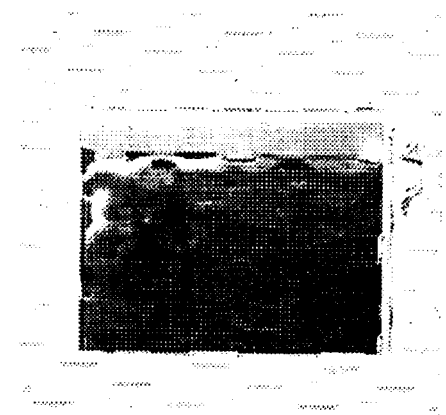
Figure 4D:
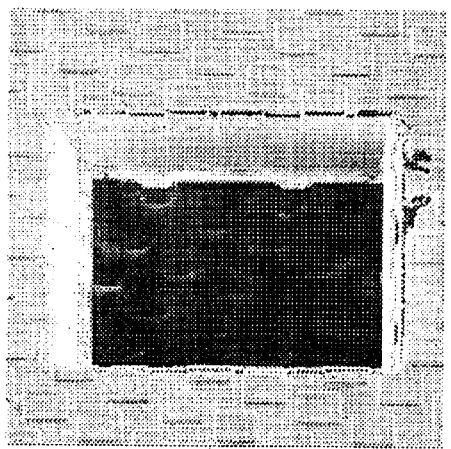
Figure 4E:
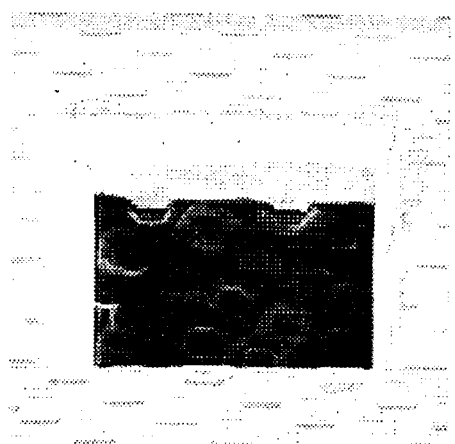
Figure 4F:
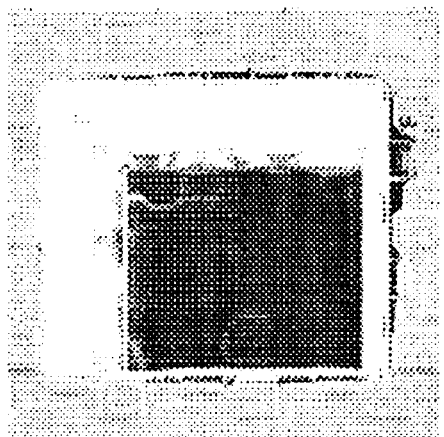
Figure 4G:
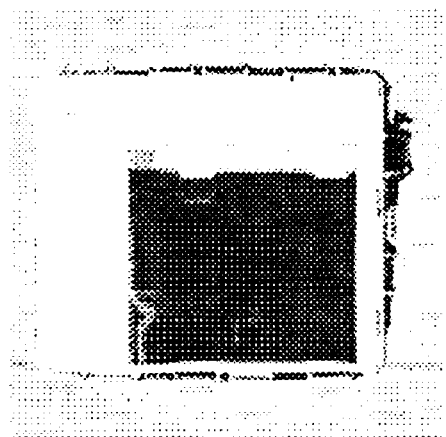
Figure 4H:
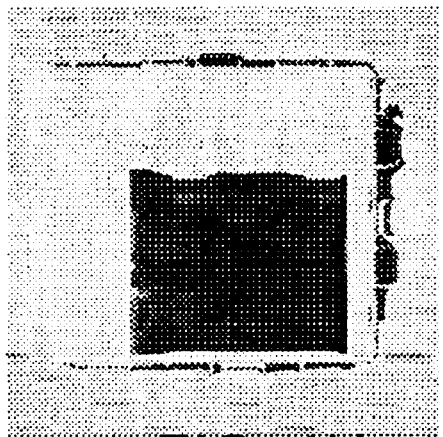
Figure 4I:
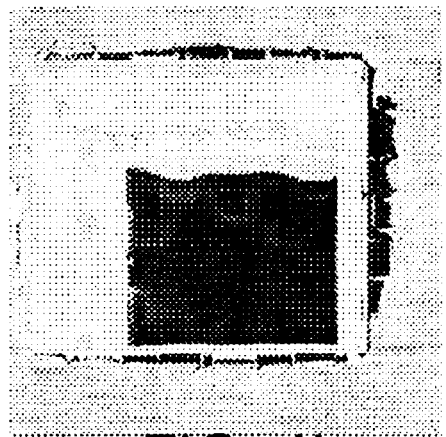

FIG. 4C shows the sample after the second dummy copper and dielectric layer has been removed and after an $H_2O$ etch. FIG. 4D shows the sample after the third dummy copper and dielectric layer has been removed and after an $H_2O$ etch. FIG. 4E shows the sample after the fourth dummy copper and dielectric layer has been removed and after an $H_2O$ etch. FIG. 4F shows the sample after the fifth dummy copper and dielectric layer has been removed and after an $H_2O$ etch. FIG. 4G shows the sample after the sixth dummy copper and dielectric layer has been removed and after an $H_2O$ etch. FIG. 4H shows the sample after the seventh dummy copper and dielectric layer has been removed and after an $H_2O$ etch. And finally, FIG. 4I shows the sample after the eighth dummy copper and dielectric layer has been removed and after an $H_2O$ etch.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of removing one or more mixed copper and dielectric layers from an area of a target, the method comprising:

defining the target area to be removed;

directing a focused ion beam toward a first mixed copper and dielectric layer in a first pattern, characterized by a first pixel spacing greater than a spot size characterizing the focused ion beam;

directing the focused ion beam toward a first mixed copper and dielectric layer in one or more additional patterns, each of the one or more additional patterns characterized by a pixel spacing and, if more than one additional patterns are used, each of the more than one additional pattern having a progressively closer pixel spacing, until the pixel spacing of the last pattern is less than or approximately equal to the ion beam spot size; thereby substantially removing the first mixed copper and dielectric layer from the target area;

directing an oxygen containing gas toward the target area; and directing a focused ion beam toward the target area, thereby removing any remaining first mixed copper and dielectric layer and producing a uniformly smooth floor in the milled target area.

2. The method of claim 1 in which two or more mixed copper and dielectric layers are removed.

3. The method of claim 2 in which said two or more mixed copper and dielectric layers are separated by a layer of dielectric.

4. The method of claim 3 in which directing an oxygen containing gas comprises directing a jet of water vapor, oxygen, or other oxygen containing vapor toward the impact point of the ion beam to inhibit etching of the dielectric layer under the mixed copper and dielectric layer.

5. The method of claim 2 in which each mixed copper and dielectric layer is removed producing a substantially uniform floor in the milled target area before the next mixed copper and dielectric layer is milled.

6. The method of claim 1 further comprising:

after defining the target area to be removed and before directing a focused ion beam toward the mixed copper and dielectric layer in a first pattern, directing an etch-assisting gas toward the target area; and directing a focused ion beam toward the target area to remove any surface layer of material covering said first mixed copper and dielectric layer.

7. The method of claim 1 further comprising:

after defining the target area to be removed and before directing a focused ion beam toward the mixed copper and dielectric layer in a first pattern, forming a layer of material over the target area, said layer of material interacting with the focused ion beam to increase the uniformity of the removal of the first mixed copper and dielectric layer by the focused ion beam.

8. The method of claim 7 in which forming a layer includes directing a precursor gas toward the area of the target concurrently with directing a focused ion beam toward the area of the target, the precursor gas decomposing in the presence of the focused ion beam to form the layer.

9. The method of claim 1 further comprising:

after substantially removing said mixed copper and dielectric layer from the target area and before directing an oxygen containing gas toward the target area, directing an etch assisting gas toward the target area; and directing a focused ion beam toward the target area, thereby removing any residual material resulting from redeposition.

10. A method of removing two or more layers of material from an area of a target, the method comprising:

defining the target area to be removed;

directing a focused ion beam a first time toward a first layer of material, thereby substantially removing the first layer of material from the target area;

directing an oxygen containing gas toward the target area;

directing a focused ion beam a second time toward the target area to remove any remaining material from said first layer of material, thereby producing a substantially uniform smooth floor in the milled target area; and directing a focused ion beam toward a second layer of material, thereby substantially removing the second layer of material from the target area.

11. The method of claim 10 in which after each layer of material is removed, a substantially uniform floor is produced in the target area before the next layer of material is removed.

12. The method of claim 10 in which the material to be removed includes atoms arranged in a crystalline structure.

13. The method of claim 10 in which the material to be removed comprises copper, dielectric, or a mixture of copper and dielectric.

14. The method of claim 10 in which said two or more layers of material are separated by an insulating layer.

15. The method of claim 14 further comprising directing a jet of water vapor, oxygen, or other oxygen containing vapor toward the impact point of the ion beam to inhibit etching of the insulating layer.

16. The method of claim 10 in which the oxygen containing gas comprises water vapor.

17. The method of claim 10 in which directing a focused ion beam a first time toward a first layer of material further comprises:

directing said focused ion beam toward a first layer of material in a first pattern characterized by a first pixel spacing greater than a spot size characterizing the focused ion beam; and directing the focused ion beam toward a first layer of material in a second pattern characterized by a second pixel spacing, the second pixel spacing being less than the first pixel spacing and less than or approximately equal to the ion beam spot size, thereby substantially removing the first layer of material from the target area.

18. The method of claim 17 further comprising:

after directing a focused ion beam a second time toward the target area to remove any remaining material from said first layer of material and before directing a focused ion beam toward a second layer of material, directing an oxygen containing gas toward the target area; and directing a focused ion beam toward the target area to remove any remaining material from said second layer of material, thereby producing a substantially uniform smooth floor in the milled target area.

19. The method of claim 17 further comprising:

after defining the target area to be removed and before directing a focused ion beam toward a first layer of material in a first pattern, directing an etch-assisting gas toward the target area; and directing a focused ion beam toward the target area to remove any surface layer covering said first layer of material.

20. The method of claim 17 further comprising:

after defining the target area to be removed and before directing a focused ion beam toward a first layer of material in a first pattern, forming a layer of a second material over the target area, said layer interacting with the focused ion beam to increase the uniformity of the removal of the first layer of material by the focused ion beam.

21. The method of claim 20 in which forming a layer includes directing a precursor gas toward the area of the target concurrently with directing a focused ion beam toward the area of the target, the precursor gas decomposing in the presence of the focused ion beam to form the layer.

22. The method of claim 21 in which the precursor gas comprises metalorganic gas molecules.

23. The method of claim 22 in which the metalorganic gas molecules comprise tungsten, platinum, or gold.

24. The method of claim 17 further comprising:

after substantially removing said first layer of material from the target area and before directing an oxygen containing gas toward the target area, directing an etch assisting gas toward the target area; and directing a focused ion beam toward the target area, thereby removing any residual material resulting from redeposition.

25. A method of removing material from an area of a target, the method comprising:

defining the target area of a first material to be removed;

forming a layer of a second material over the target area, said layer capable of interacting with a focused ion beam to increase the uniformity of the removal of the first material by the focused ion beam;

directing a focused ion beam toward target area in a first pattern, characterized by a first pixel spacing greater than a spot size characterizing the focused ion beam;

directing the focused ion beam toward target area in a second pattern characterized by a second pixel spacing, the second pixel spacing being less than the first pixel spacing and less than or approximately equal to the ion beam spot size, thereby substantially removing the material from the target area;

directing an oxygen containing gas toward the target area; and directing a focused ion beam toward the target area to remove any remaining material, thereby producing a substantially uniform smooth floor in the milled target area.

26. The method of claim 25 in which forming a layer includes directing a precursor gas toward the area of the target concurrently with directing a focused ion beam toward the area of the target, the precursor gas decomposing in the presence of the focused ion beam to form the layer.

27. The method of claim 25 in which the material to be removed comprises copper, dielectric, or a mixture of copper and dielectric.

* * * * *